(12) United States Patent
Tien et al.

(10) Patent No.: US 8,333,498 B2
(45) Date of Patent: Dec. 18, 2012

(54) BACK BEZEL ASSEMBLY

(75) Inventors: Ching-Fu Tien, Hsinchu (TW); Yen-Lin Lee, Hsinchu (TW); Shih-Che Fu, Hsinchu (TW); Chao-Chih Wei, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 477 days.

(21) Appl. No.: 12/543,092

(22) Filed: Aug. 18, 2009

(65) Prior Publication Data

US 2010/0202149 A1 Aug. 12, 2010

(30) Foreign Application Priority Data

Feb. 6, 2009 (TW) .............................. 98103834 A

(51) Int. Cl.
*F21V 7/04* (2006.01)
(52) U.S. Cl. ........ 362/633; 362/632; 362/634; 362/97.1
(58) Field of Classification Search .................. 362/373, 362/632, 634, 97.1, 97.4
See application file for complete search history.

(56) References Cited

U.S. PATENT DOCUMENTS

| | | | | |
|---|---|---|---|---|
| 7,281,837 B2* | 10/2007 | Yue et al. | ...................... | 362/623 |
| 2003/0048598 A1* | 3/2003 | Lee et al. | ...................... | 361/681 |
| 2005/0088809 A1 | 4/2005 | Nakagawa et al. | | |
| 2007/0081344 A1 | 4/2007 | Cappaert et al. | | |
| 2007/0091223 A1* | 4/2007 | Maruta et al. | .................... | 349/58 |
| 2007/0147022 A1 | 6/2007 | Lee et al. | | |
| 2008/0278957 A1* | 11/2008 | Pickard et al. | ................ | 362/373 |

FOREIGN PATENT DOCUMENTS

| | | |
|---|---|---|
| CN | 100371788 | 2/2008 |
| CN | 101241268 | 8/2008 |
| TW | M327037 | 2/2008 |
| WO | WO2009/006380 | * 8/2009 |

OTHER PUBLICATIONS

Chinese language office action dated Dec. 11, 2009.
English language translation of abstract and pertinent parts of CN 101241268 (published Aug. 13, 2008).
English language translation of abstract and pertinent parts of CN 100371788 (published Feb. 27, 2008).
Taiwan Office Action mailed Jul. 25, 2012.
English translation of abstract of TW M327037.
English translation of pertinent parts of Taiwan Office Action mailed Jul. 25, 2012.

* cited by examiner

*Primary Examiner* — Evan Dzierzynski
(74) *Attorney, Agent, or Firm* — McClure, Qualey & Rodack, LLP

(57) ABSTRACT

A back bezel assembly is provided. The back bezel assembly includes a frame and a metal shielding board. The frame is formed with at least one hollow portion. By forming at least one hollow portion, the frame is not formed with at least one first portion with the same material of the frame, wherein the at least one first portion has a first weight. The metal shielding board has a second weight, which is less than the first weight. The metal shielding board is fixed to the frame and covers at least one portion of the at least one hollow portion correspondingly. With the configuration of the back bezel assembly, the display adopting the back bezel assembly is lightweight and provided with the shielding effect of EMI (Electromagnetic Interference).

20 Claims, 4 Drawing Sheets

BACK BEZEL ASSEMBLY

This application claims the benefit from the priority of Taiwan Patent Application No. 098103834 filed on Feb. 6, 2009, the disclosures of which is incorporated by reference herein in their entirety.

CROSS-REFERENCES TO RELATED APPLICATIONS

Not applicable.

BACKGROUND OF THE INVENTION

1. Field of the Invention

The present invention relates to a back bezel assembly, in particular, a lightweight back bezel assembly.

2. Descriptions of the Related Art

With the widespread application of digital information, the percentage of individuals that use digital displays increase accordingly. In conventional digital displays, the back bezels of backlight modules are made of metal materials to provide secure support. However, as the digital displays become increasingly larger in size, the weight of the back bezels also increase remarkably, which increases the overall weight and material cost of the digital displays. Accordingly, because more lightweight and thin digital apparatuses are desired, the back bezels of the large-size digital displays have been hollowed out, with only necessary structures left on the back bezels, thereby decreasing the weight of the digital displays. Unfortunately, the holes thus formed will greatly degrade the Electro-magnetic Interference (EMI) shielding effect of the back bezels. Leakage of massive EMIs will affect the normal operation of other electronic components in the digital displays, and even impose an adverse effect on the user's heath. Secondly, the back bezel with hollow portions may cause damage to the original integral structure, resulting in a weakened back bezel and consequently fail to provide desirable support. Therefore, electronic components disposed on the inner side of the back bezels may also be damaged by potential impact due to the lack of protection from the back bezel structure.

In view of this, efforts still have to be made in the art to provide a back bezel assembly that is lightweight, able to demonstrate a desirable EMI shielding effect and adapted to provide secure support and protection for backlight modules.

SUMMARY OF THE INVENTION

One objective of this invention is to provide a back bezel assembly for a backlight module of a display. With the light weight, the back bezel assembly provides a desirable EMI shielding effect to prevent electromagnetic waves generated by specific electronic components from interfering with the normal operation of other neighboring electronic components and impose an adverse effect on human health.

Another objective of this invention is to provide a back bezel assembly for a backlight module of a display. With the light weight, the back bezel assembly can provide support against flex and protect components inside the display from damaging by external forces.

The back bezel assembly of this invention comprises a frame and a metal shielding board. The frame is formed with at least one hollow portion, by which the frame is not formed with at least one first portion made of the same material as that of the frame, wherein the at least one first portion has a first weight. The metal shielding board has a second weight less than the first weight. The metal shielding board is fixed to the frame and covers at least one portion of the at least one hollow portion correspondingly.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
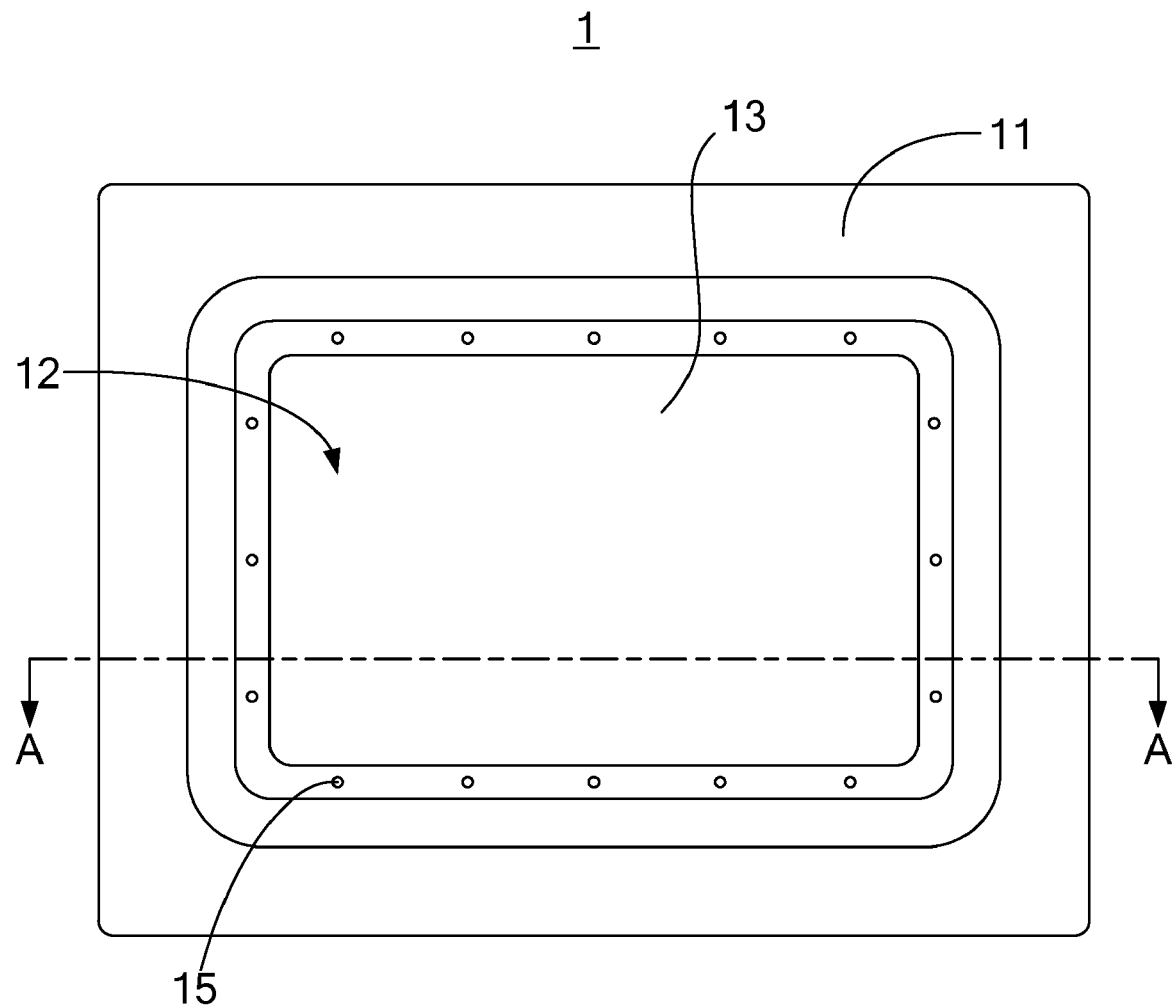
FIG. 1A is a front view of the first embodiment of a back bezel assembly of this invention.
Figure 1B:
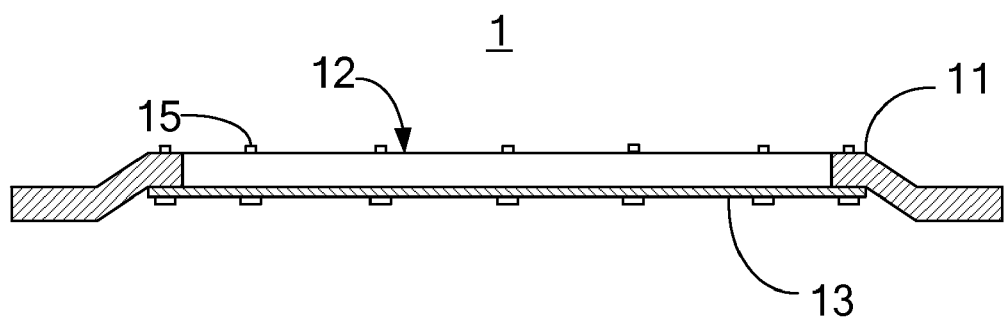
FIG. 1B is a cross-sectional view of the FIG. 1A along line A-A.

As shown in FIGS. 1A and 1B, the first embodiment of this invention is a back bezel assembly 1 for a backlight module (not shown) of a display (not shown). The back bezel assembly 1 comprises a frame 11 and a metal shielding board 13. The frame 11 is formed with at least one hollow portion 12. By forming at least one hollow portion 12, the frame 11 is not formed with at least one first portion made of the same material as that of the frame 11. In practical application, a semi-finished frame that has not been formed with the at least one hollow portion 12 may be provided first, and then processed through a stamping or another cutting process to remove the first portion to form the frame 11 with the hollow portion 12. However, the invention is not limited thereto; rather, the frame 11 may also be directly formed with the hollow portion 12 through casting or other manufacturing processes. Those skilled in the art may know other approaches to form the frame 11 with the hollow portion 12.

The metal shielding board 13 has a second weight, which is less than a first weight of the first portion that has the same material as the frame 11. As shown, in this embodiment, the hollow portion 12 is defined at the central area of the frame 11 and shaped like a rectangle. The metal shielding board 13 is fixed to the frame 11 and covers the hollow portion 12 entirely to prevent the electromagnetic waves generated by electronic components inside the display from escaping out through the hollow portion 12. Thereby, an optimal EMI shielding effect is provided.

In this embodiment, the frame 11 and the metal shielding board 13 are made of metal materials. Preferably, the frame 11 is made of a material selected from the group consisting of galvanized steel and stainless steel, while the metal shielding board 13 is made of a material selected from the group consisting of aluminum and stainless steel. The frame 11 has a thickness, which preferably ranges between 0.8 mm and 1.2 mm. The metal shielding board 13 has a thickness, which preferably ranges between 0.25 mm and 0.5 mm. According to the difference in thickness from the frame 11, the second weight of the metal shielding board 13 is less than the first weight of the frame 11, thus accomplishing a lightweight effect. Furthermore, the metal shielding board 13 also provides a sufficiently large support force for the back bezel assembly 1 and provides an anti-flexure effect and anti-impact effect.

In the above embodiment, as shown in FIG. 1, the metal shielding board 13 may be fixed to the frame 11 by means of a plurality of screws 15 so that the periphery of the metal shielding board 13 is abutted against the frame 11. However, the means that the metal shielding board 13 is fixed is not limited thereto; rather, the metal shielding board 13 may be welded, riveted or adhered to the frame 11. The detail structure adopting aforementioned fastening means for metal shielding board 13 will be readily appreciated by those skilled in the art, and thus will not be further described or depicted herein.

Figure 2A:
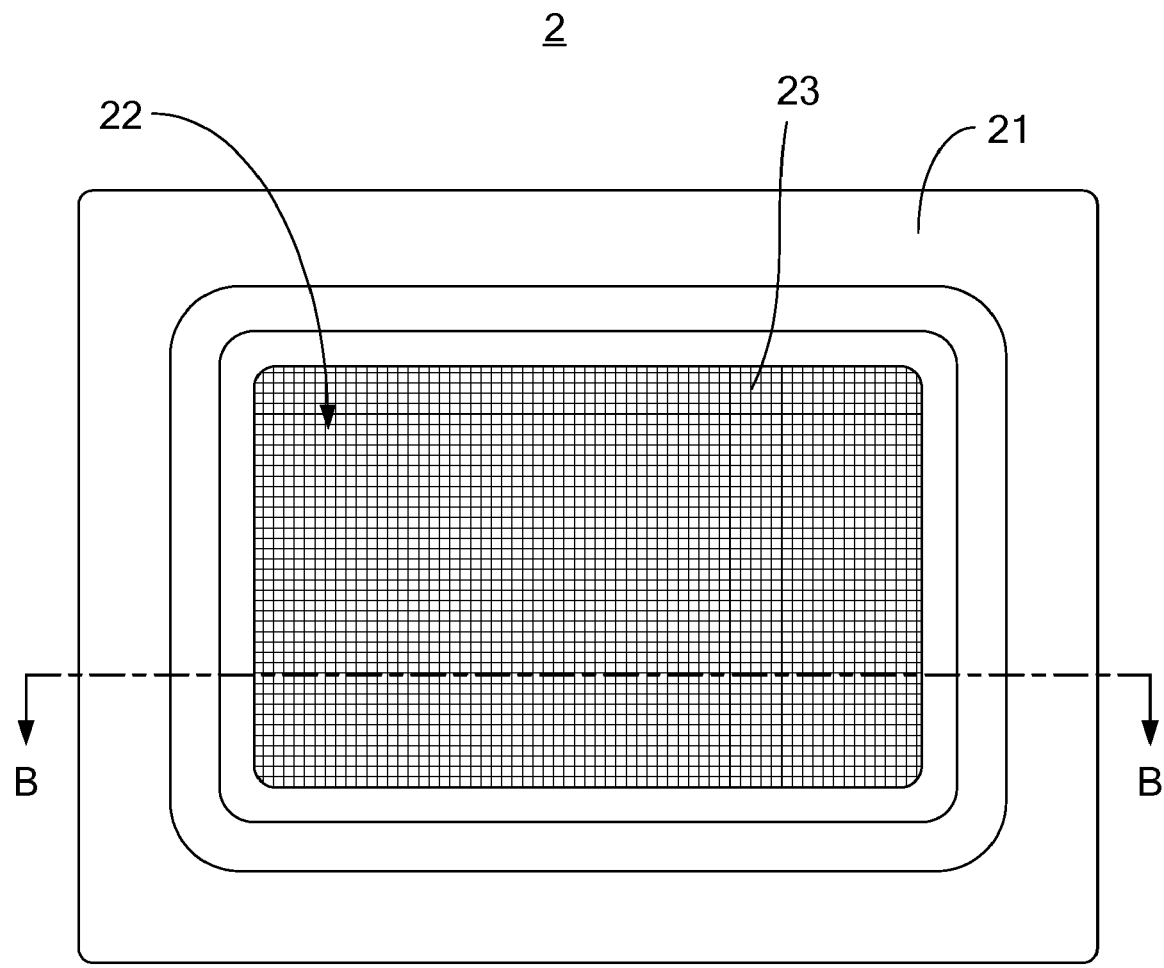
FIG. 2A is a front view of the second embodiment of a back bezel assembly of this invention.
Figure 2B:
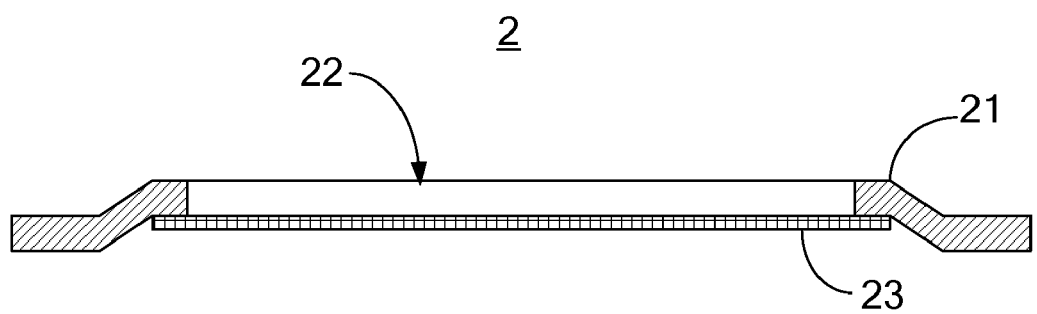
FIG. 2B is a cross-sectional view of the FIG. 2A along line B-B.

As shown in FIGS. 2A and 2B, in a back bezel assembly 2 according to the second embodiment of this invention, the metal shielding board is a metal mesh 23 formed with a plurality of holes. This is adapted to have a lighter second weight while still providing an adequate EMI shielding effect. Preferably, in this embodiment, the metal mesh 23 has a line width substantially ranging between 0.1 and 4.0 mm, a line pitch substantially ranging between 4.5 and 10 mm, and a thickness of substantially 1.0 mm. The metal mesh 23 is fixed to the frame 21 to cover the hollow portion 22 entirely. Other structures and the hollow portion 22 of the back bezel assembly 2 of the second embodiment are formed in the same way as those of the first embodiment, and thus will not be described herein.

Figure 3A:
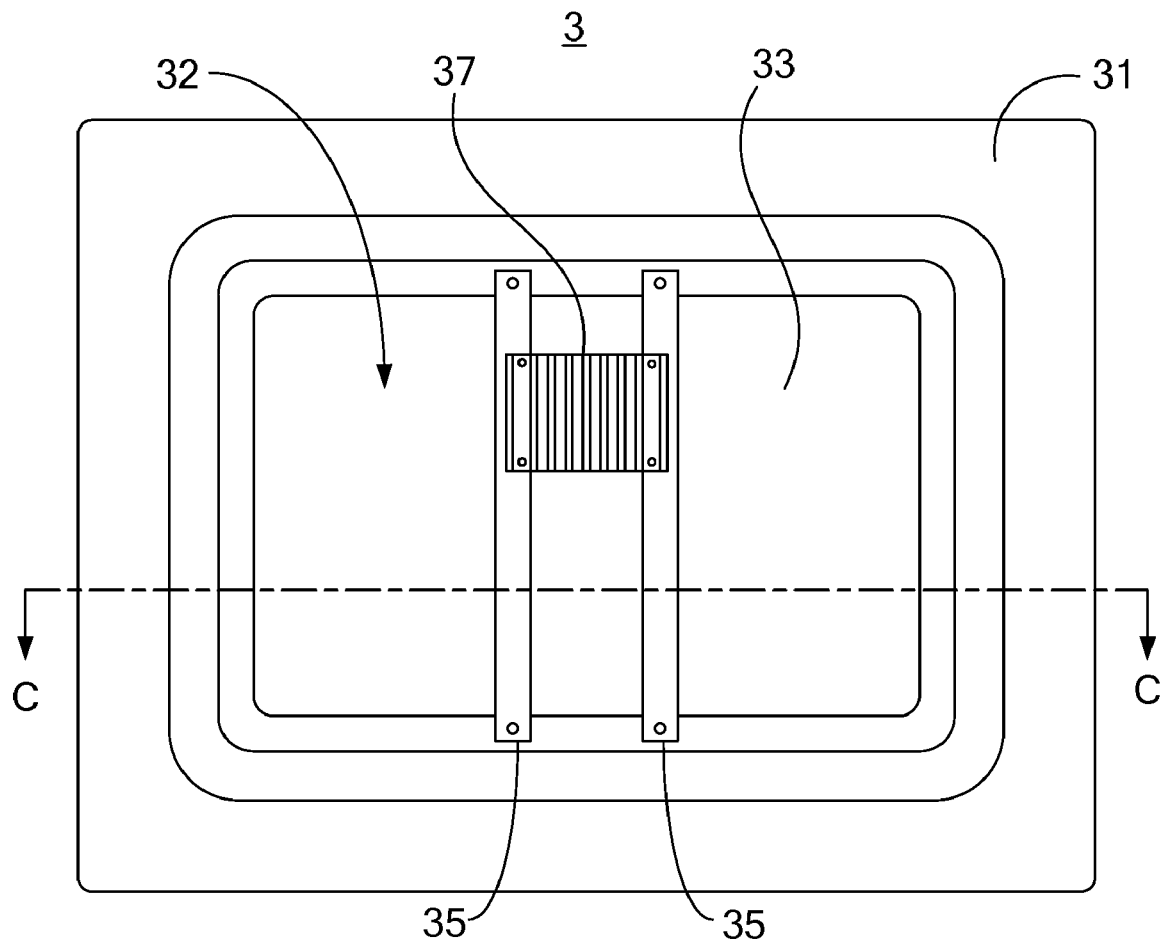
FIG. 3A is a front view of the third embodiment of a back bezel assembly of this invention.
Figure 3B:
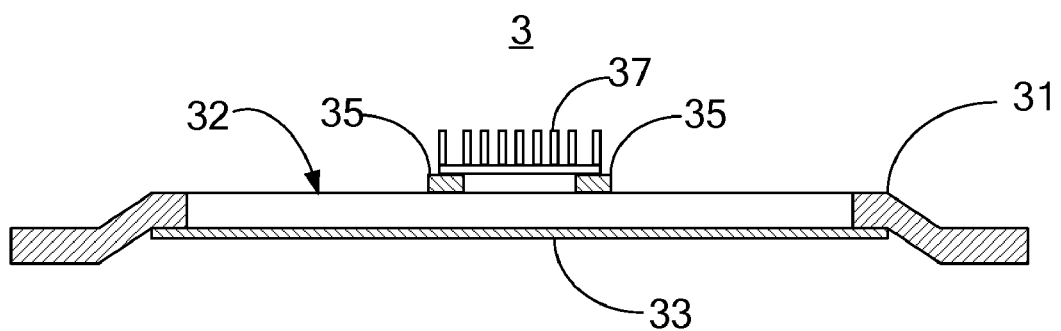
FIG. 3B is a cross-sectional view of the FIG. 3A along line C-C.

To further enhance the effect in the anti-flexure of the frame, a back bezel assembly 3 according to the third embodiment of this invention is further provided as shown in FIGS. 3A and 3B. The back bezel assembly 3 may further comprise two brackets 35. However, the number of brackets 35 is not limited thereto, and there may be more brackets in other embodiments. The brackets 35 are fixed to the back side of the frame 31, and the metal shielding board 33 is fixed to the front side of the frame 31 to cover the hollow portion 32.

In the third embodiment, a heat sink 37 may be further disposed on the brackets 35 in contact with the electronic components (not shown). Since the heat generated by the electronic components of the backlight module is large, the disposition of the heat sink 37 helps to dissipate heat from the electronic components, thus avoiding the phenomenon of overheat. Other structures and the hollow portion 32 of the back bezel assembly 3 of the third embodiment are formed in the same way as those of the first embodiment, and thus will not be described herein.

Figure 4:
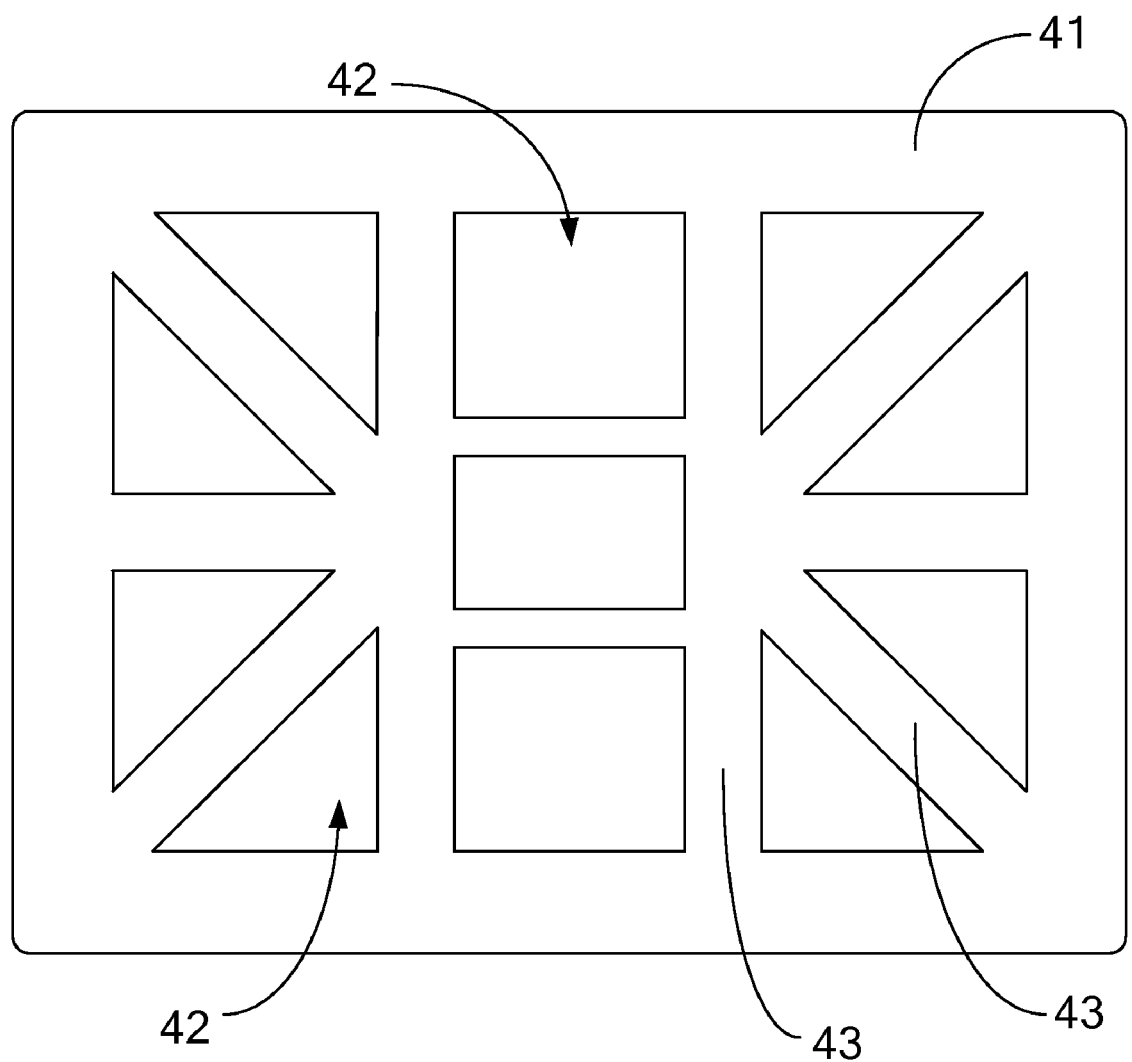
FIG. 4 is a front view of the fourth embodiment of a frame of this invention.

The fourth embodiment of this invention is shown in FIG. 4. To further enhance the strength of the frame 41, the frame 41 may be further formed with a plurality of strengthen members 43 and a plurality of corresponding hollow portions 42. By forming the plurality of hollow portions 42, the frame 41 is not formed with a plurality of first portions with the same material as the frame 41, wherein the plurality of first portions totally has a first weight. The hollow portions 42 are formed in the same way as those of the first embodiment, and thus will not be described herein.

In this embodiment, the metal shielding board 13 of the first embodiment or the metal mesh 23 of the second embodiment may be used to cover at least one portion (i.e., disposed only at portions where electromagnetic waves are expected to escape) of the plurality of hollow portions 42 of the frame 41 correspondingly. Similarly, the metal shielding board of this embodiment has a second weight, which is less than the first weight. It should be noted that what is depicted in FIG. 4 is only for illustration, and the hollow portions 42 and the strengthen members 43 may also have other shapes.

According to the above descriptions, this invention provides a back bezel assembly distinct from conventional ones. In the back bezel assembly of this invention, the frame is formed with at least one hollow portion and a lightweight metal shielding board is used to cover the at least one hollow portion so that the overall weight of the back bezel assembly decreases. Through the disposition of the metal shielding board, the back bezel assembly of this invention demonstrates a desirable EMI shielding effect, provides improved effect in anti-flexure of the frame, and provides better protection for electronic components inside the back bezel assembly to prevent damage by external forces.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A back bezel assembly for a back light module of a display, the back bezel assembly comprising:
   a frame formed with at least one hollow portion, by which the frame is not formed with at least one first portion made of the same material as that of the frame, in which the at least one first portion has a first weight; and
   a solid, metal shielding board, having a second weight less than the first weight, in which the metal shielding board is fixed to the frame and completely covers the at least one hollow portion correspondingly.

2. The back bezel assembly as claimed in claim 1, wherein the frame has a thickness between 0.8 and 1.2 mm substantially.

3. The back bezel assembly as claimed in claim 1, wherein the metal shielding board has a thickness between 0.25 and 0.5 mm substantially.

4. The back bezel assembly as claimed in claim 1, wherein the frame is made of a material selected from the group consisting of galvanized steel and stainless steel.

5. The back bezel assembly as claimed in claim 1, wherein the metal shielding board is made of a material selected from the group consisting of aluminum and stainless steel.

6. The back bezel assembly as claimed in claim 1, wherein the metal shielding board is fixed to the frame by riveting.

7. The back bezel assembly as claimed in claim 1, wherein the metal shielding board is fixed to the frame by welding.

8. The back bezel assembly as claimed in claim 1, wherein the metal shielding board is fixed to the frame by screwing.

9. The back bezel assembly as claimed in claim 1, wherein the metal shielding board is fixed to the frame by adhering.

10. The back bezel assembly as claimed in claim 1, further comprising a bracket, wherein the frame has a front side for the metal shielding board being fixed thereto and a back side for the bracket being fixed thereto.

11. The back bezel assembly as claimed in claim 10, further comprising a heat sink fixed to the bracket.

12. The back bezel assembly as claimed in claim 1, wherein the frame forms a plurality of hollow portions and a plurality of strengthen members, the hollow portions are defined by the strengthen members and removing a plurality of first portions made of the same material as that of the frame, in which the first portions totally have the first weight and the second weight is less than the first weight.

13. A back bezel assembly for a back light module of a display, the back bezel assembly comprising:
a frame formed with at least one hollow portion, by which the frame is not formed with at least one first portion made of the same material as that of the frame, in which the at least one first portion has a first weight; and
a metal mesh, having a second weight less than the first weight, formed with a plurality of holes, and having a line width between 0.1 and 4.0 mm and a line pitch between 4.5 and 10 mm substantially, in which the metal mesh is fixed to the frame and completely covers the at least one hollow portion correspondingly.

14. The back bezel assembly as claimed in claim 13, wherein the metal mesh has a thickness which is substantially 1.0 mm.

15. The back bezel assembly as claimed in claim 13, wherein the frame has a thickness between 0.8 and 1.2 mm substantially.

16. The back bezel assembly as claimed in claim 13, wherein the frame is made of a material selected from the group consisting of galvanized steel and stainless steel.

17. The back bezel assembly as claimed in claim 13, wherein the metal mesh is made of a material selected from the group consisting of aluminum and stainless steel.

18. The back bezel assembly as claimed in claim 13, wherein the metal mesh is fixed to the frame by riveting welding, screwing or adhering.

19. The back bezel assembly as claimed in claim 13, further comprising a bracket, wherein the frame has a front side for the metal mesh being fixed thereto and a back side for the bracket being fixed thereto.

20. The back bezel assembly as claimed in claim 19, further comprising a heat sink fixed to the bracket.

* * * * *